(12) United States Patent
Liu

(10) Patent No.: US 10,416,733 B2
(45) Date of Patent: Sep. 17, 2019

(54) HEAT DISSIPATION SYSTEM AND HEAT DISSIPATION METHOD

(71) Applicant: INSPUR ELECTRONIC INFORMATION INDUSTRY CO., LTD, Jinan, Shandong (CN)

(72) Inventor: Guangzhi Liu, Shandong (CN)

(73) Assignee: INSPUR ELECTRONIC INFORMATION INDUSTRY CO., LTD, Jinan, Shandong (CN)

( * ) Notice: Subject to any disclaimer, the term of this patent is extended or adjusted under 35 U.S.C. 154(b) by 0 days.

(21) Appl. No.: 15/745,133

(22) PCT Filed: Dec. 13, 2016

(86) PCT No.: PCT/CN2016/109583
§ 371 (c)(1),
(2) Date: Jan. 15, 2018

(87) PCT Pub. No.: WO2018/040363
PCT Pub. Date: Mar. 8, 2018

(65) Prior Publication Data
US 2019/0018463 A1    Jan. 17, 2019

(30) Foreign Application Priority Data
Aug. 29, 2016  (CN) .......................... 2016 1 0753849

(51) Int. Cl.
*G06F 1/20* (2006.01)
*H05K 7/20* (2006.01)

(52) U.S. Cl.
CPC .......... *G06F 1/20* (2013.01); *H05K 7/20163* (2013.01); *H05K 7/20727* (2013.01); *H05K 7/20836* (2013.01); *H05K 7/20909* (2013.01)

(58) Field of Classification Search
CPC ... G06F 1/20; H05K 7/20163; H05K 7/20909
See application file for complete search history.

(56) References Cited

U.S. PATENT DOCUMENTS

2009/0279247 A1   11/2009  Chen et al.
2014/0036433 A1*   2/2014  Guan ........................ G06F 1/20
                                                 361/679.32
(Continued)

FOREIGN PATENT DOCUMENTS

CN           2708376 Y       7/2005
CN         201440775 U       4/2010
(Continued)

OTHER PUBLICATIONS

International Search Report and Written Opinion from International Application No. PCT/CN2016/109583, dated May 31, 2017.

*Primary Examiner* — Anthony M Haughton
*Assistant Examiner* — Yahya Ahmad
(74) *Attorney, Agent, or Firm* — Yu (Robert) Xu; Apex Attorneys at Law, LLP

(57) ABSTRACT

A heat dissipation system includes a motherboard, at least two chips, at least two heat sinks and at least two air guide covers. Every two chips of the at least two chips constitute a chipset, the chips in each chipset are installed on the motherboard in sequence along an airflow direction, each of the at least heat sinks is installed on a surface of the chip corresponding to the heat sink, and every two air guide covers of the at least two air guide covers constitute an air guide group. In the air guide group, a first air guide cover is arranged on a first side of a first chip, and a second air guide cover is arranged on a second side of a second chip. A heat dissipation method based on the system is also provided. The solution ensures a relatively uniform heat dissipation between the chips.

17 Claims, 4 Drawing Sheets

(56) References Cited

U.S. PATENT DOCUMENTS

| | | | | |
|---|---|---|---|---|
| 2014/0334093 A1* | 11/2014 | Wei | ........................... | G06F 1/20 |
| | | | | 361/679.47 |
| 2015/0043148 A1* | 2/2015 | Zhang | ................ | H05K 7/20727 |
| | | | | 361/679.32 |
| 2016/0212880 A1* | 7/2016 | Wang | ........................ | G06F 1/20 |
| 2018/0095508 A1* | 4/2018 | Yi | ........................... | G06F 1/20 |
| 2018/0343768 A1* | 11/2018 | Yang | .................. | H05K 7/20145 |

FOREIGN PATENT DOCUMENTS

| | | | |
|---|---|---|---|
| CN | 103793030 A | 5/2014 | |
| CN | 104282639 A | 1/2015 | |
| CN | 104898814 A | 9/2015 | |
| CN | 105023892 A | 11/2015 | |

* cited by examiner

HEAT DISSIPATION SYSTEM AND HEAT DISSIPATION METHOD

This application is the national phase of International Application No. PCT/CN2016/109583, titled "HEAT DISSIPATION SYSTEM AND HEAT DISSIPATION METHOD", filed on Dec. 13, 2016 which claims the benefit of priority to Chinese patent application No. 201610753849.5 titled "HEAT DISSIPATION SYSTEM AND HEAT DISSIPATION METHOD", filed with the Chinese State Intellectual Property Office on Aug. 29, 2016, the entire disclosures of which applications are incorporated herein by reference.

TECHNICAL FIELD

The present application relates to the field of computer technology, and in particular to a heat dissipation system and a heat dissipation method.

BACKGROUND

Currently, in order to enhance the computing power of server, multiple chips and multiple memory banks are generally arranged on a motherboard for the server, and the multiple chips are arranged in sequence and the memory banks are arranged on both sides of the chips respectively. Heat dissipation is usually required to be performed on the chips and the memory banks during operation of the server.

Presently, a main heat dissipation method for the multiple chips and the multiple memory banks in the server is described below: taking two chips as a group, the two chips in the group are arranged along an airflow direction in sequence, the airflow firstly flows through a heat sink of the chip at a front end, and takes away heat of the heat sink, and then the airflow enters the chip at a rear end directly. In this way, after the airflow flows through the chip at the front end, a temperature of the airflow rises to a certain degree, and a cooling intensity is greatly decreased when the airflow enters the chip at the rear end, hence, a service life of the chip at the front end is significantly longer than that of the chip at the rear end. Therefore, the conventional heat dissipation method results in nonuniform heat dissipation between the chips in the server.

SUMMARY

A heat dissipation system and a heat dissipation method are provided according to embodiments of the present application, which can ensure relatively uniform heat dissipation between chips in the server.

A heat dissipation system includes: a motherboard, at least two chips, at least two heat sinks and at least two air guide covers;
every two chips of the at least two chips constitute a chipset;
the chips in the chipset are installed on the motherboard in sequence along an airflow direction;
each of the at least two heat sinks is installed on a surface of the chip corresponding to the heat sink;
every two air guide cover of the at least two air guide covers constitute an air guide group;
where in the air guide group, a first air guide cover is arranged on a first side of a first chip of the chipset corresponding to the air guide group, which side is parallel to the airflow direction, and is configured to guide a first airflow into the heat sink corresponding to the first chip; and
a second air guide cover is arranged on a second side of a second chip of the chipset corresponding to the air guide group, which side is parallel to the first side and is in the same line with an opposite side of the first side, and is configured to guide a second airflow which does not flow through the heat sink corresponding to the first chip into the heat sink corresponding to the second chip, and guide the first airflow to bypass the heat sink corresponding to the second chip when the first airflow flows through the heat sink corresponding to the first chip.

Preferably, the above heat dissipation system may further include at least four card slots, where
each of the at least four card slots is installed on the motherboard, every two card slots are arranged on both sides of the chip parallel to the airflow direction and are configured to insert peripheral memory banks respectively;
the first air guide cover is configured to cover the card slot arranged on the first side; and
the second air guide cover is configured to cover the card slot arranged on the second side and guide the second airflow, which flows through the card slot corresponding to the first chip and not covered by the air guide cover into the heat sink corresponding to the second chip.

Preferably, each of the at least two air guide covers may include a rectangular groove and two air guide openings arranged on sidewalls of the rectangular groove; and
a first air guide opening and a second air guide opening of the two air guide openings are arranged on the two parallel sidewalls of the rectangular groove, and are perpendicular to the airflow direction.

Preferably, the first air guide opening of the first air guide cover may receive a third airflow, and the third airflow flows out via the second air guide opening, to dissipate heat from inside of the first air guide cover.

Preferably, the first air guide opening of the second air guide cover may receive a fourth branch airflow branched from the second airflow, and the fourth branch airflow flows out via the second air guide opening of the second air guide cover, to dissipate heat from inside of the second air guide cover.

Preferably, the rectangle groove of each of the at least two air guide covers has a size of 145 mm×40 mm×16 mm; and
the air guide opening is arranged on the sidewall with a size of 40 mm×16 mm of the rectangular groove, and has a size of 30 mm×5 mm.

Preferably, the two chips in the chipset have a distance not less than 15 mm.

The heat dissipation method implemented based on the heat dissipation system described above includes:
guiding, by the first air guide cover, the first airflow into the heat sink corresponding to the first chip;
guiding, by the second air guide cover, the second airflow which does not flow through the heat sink corresponding to the first chip into the heat sink corresponding to the second chip; and
guiding, by the second air guide cover, the first airflow to bypass the heat sink corresponding to the second chip when the first airflow flows through the heat sink corresponding to the first chip.

Preferably, the above method further includes: covering, by the first air guide cover, the card slot arranged on the first side of the first chip; and covering, by the second air guide cover, the card slot arranged on the second side of the second chip;

the step of guiding the second airflow which does not flow through the heat sink corresponding to the first chip into the heat sink corresponding to the second chip includes: guiding the second airflow, which flows through a card slot corresponding to the first chip and not covered by the air guide cover, into the heat sink corresponding to the second chip.

Preferably, the above method further includes providing two air guide openings for each of the at least two air guide covers, a first air guide opening and a second air guide opening are arranged on two sidewalls parallel to each other, and are perpendicular to the airflow direction;

the first air guide opening of the first air guide cover receives a third airflow, and the third airflow flows from the second air guide opening of the first air guide cover, to dissipate heat from inside of the first air guide cover; and the first air guide opening of the second air guide cover receives a fourth branch airflow branched from the second airflow, and the fourth branch airflow flows from the second air guide opening of the second air guide cover, to dissipate heat from inside of the second air guide cover.

With the heat dissipation system and a heat dissipation method according to embodiments of the present application, the first airflow is guided into the heat sink corresponding to the first chip in the chipset by the first air guide cover, to dissipate heat of the first chip, and the second airflow which does not flow through the heat sink corresponding to the first chip is guided into the heat sink corresponding to the second chip by the second air guide cover, and the first airflow is guided to bypass the heat sink corresponding to the second chip by the second air guide cover when the first airflow flows through the heat sink corresponding to the first chip. In the whole heat dissipation process, the second airflow which does not flow through the first chip is used to dissipate heat from the second chip, and the second airflow and the first airflow come from the same source and similar initial temperatures. Moreover, the first airflow, after flowing through the first chip to rise its temperature, bypasses the heat sink of the second chip, thereby ensuring relatively uniform heat dissipation between chips in the server.

BRIEF DESCRIPTION OF THE DRAWINGS

For more clearly illustrating embodiments of the present application or the technical solution in the conventional technology, drawings referred to describe the embodiments or the conventional technology will be briefly described hereinafter. Apparently, the drawings in the following description are only several embodiments of the present application, and for the person skilled in the art other drawings may be obtained based on these drawings without any creative efforts.

DETAILED DESCRIPTION OF THE EMBODIMENTS

To make the object, technical solutions and advantages of the present application clearer, the technical solutions according to the embodiments of the present application will be described clearly and completely as follows in conjunction with the drawings in the embodiments of the present application. It is apparent that the described embodiments are only a part of the embodiments according to the present application, rather than all the embodiments. Any other embodiments obtained by those skilled in the art based on the embodiments in the present application without any creative efforts fall within the protection scope of the present application.

Figure 1:
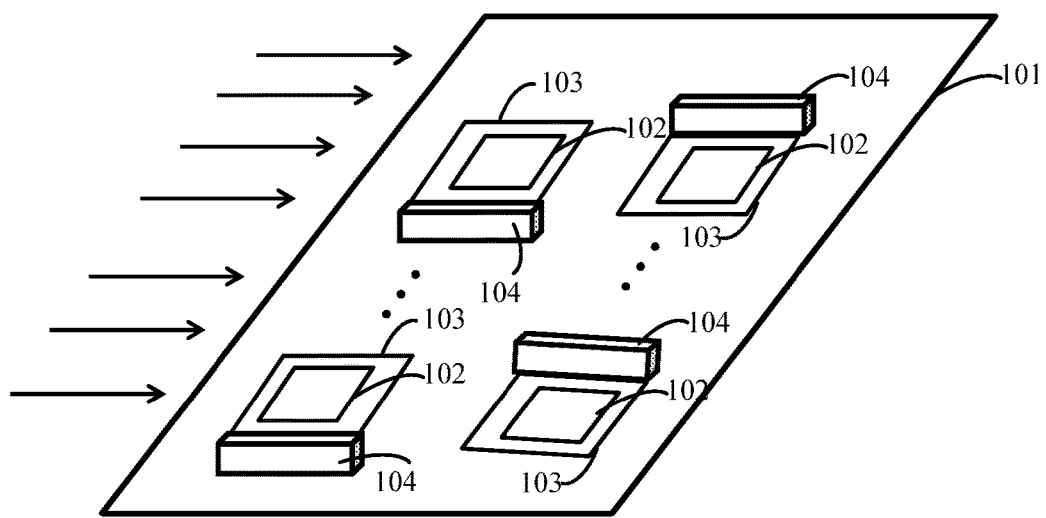
FIG. 1 is a schematic view of the structure of a heat dissipation system according to an embodiment of the present application.

As shown in FIG. 1, a heat dissipation system is provided according to an embodiment of the present application, which includes: a motherboard 101, at least two chips 102, at least two heat sinks 103 and at least two air guide covers 104. Every two chips 102 of the at least two chips 102 constitute a chipset, and the chips 102 in each chipset are installed on the motherboard 101 along an airflow direction in sequence. Each of the at least two heat sinks 103 is installed on a surface of the respective chip 102. Every two air guide covers 104 of the at least two air guide covers 104 constitute an air guide group. In each air guide group, a first air guide cover is arranged on a first side of a first chip of the respective chipset, which side is parallel to the airflow direction, and is configured to guide a first air into the heat sink corresponding to the first chip. A second air guide cover is arranged on a second side of a second chip of the respective chipset, which side is parallel to the first side and in a same line with an opposite side of the first side, and is configured to guide a second airflow which does not flow through the heat sink corresponding to the first chip into the heat sink corresponding to the second chip, and guide the first airflow to bypass the heat sink corresponding to the second chip when the first airflow flows through the heat sink corresponding to the first chip.

In the embodiment as shown in FIG. 1, the first airflow is guided, by the first air guide cover, into the heat sink corresponding to the first chip in the chipset, and is configured to dissipate heat of the first chip. A second airflow which does not flow through the heat sink corresponding to the first chip is guided, by the second air guide cover, into the heat sink corresponding to the second chip, and when the first airflow flows through the heat sink corresponding to the first chip, the first airflow is guided, by the second air guide cover, to bypass the heat sink corresponding to the second chip. In the whole heat dissipation process, the second airflow which does not flow through the first chip is used to dissipate heat of the second chip, and the second airflow and the first airflow come from the same source and have similar initial temperatures. Moreover, the first airflow, after passing the first chip to rise its temperature, bypasses the heat sink corresponding to the second chip, thereby ensuring relatively uniform heat dissipation between the chips in the server.

Figure 2:
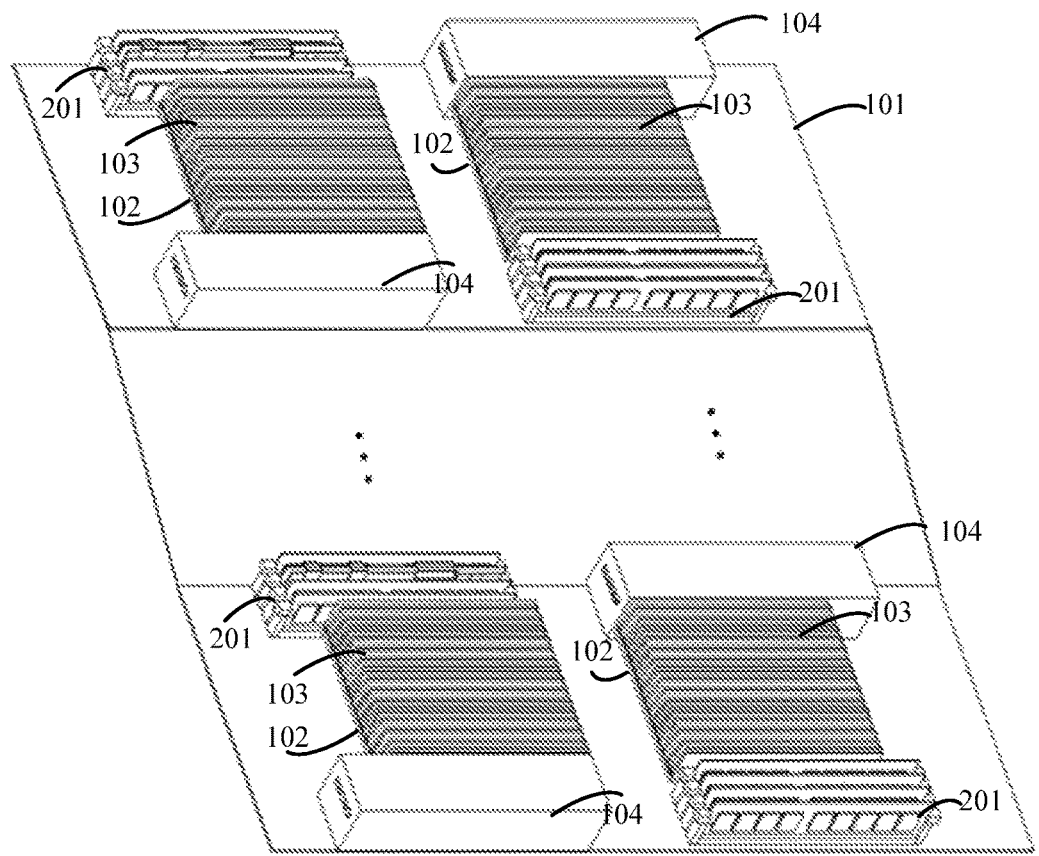
FIG. 2 is a schematic view of the structure of a heat dissipation system according to another embodiment of the present application.

As shown in FIG. 2, in another embodiment of the present application, the above heat dissipation system further includes at least four card slots 201. Each of the at least four card slots 201 is installed on the motherboard. Every two card slots are arranged on two sides parallel to the airflow direction of the chip respectively, and are configured to insert peripheral memory banks. The first air guide cover is configured to cover the card slot 201 arranged on the first side. The second air guide cover is configured to cover the card slot 201 arranged on the second side, and guide the second airflow which flows through the card slot corresponding to the first chip and not covered by the air guide cover into the heat sink corresponding to the second chip.

The heat generated by the memory bank is small, and as shown in FIG. 2, the card slot on one side of the chip and the memory bank installed in the card slot are covered together, thus the airflow preferentially flows through the chip and the other card slot not covered, and the airflow flowing through the card slot not covered is guided into the other chip through the air guide cover, thereby ensuring high airflow utilization rate and ensuring heat dissipation between the chips to be as uniform as possible.

Figure 3:
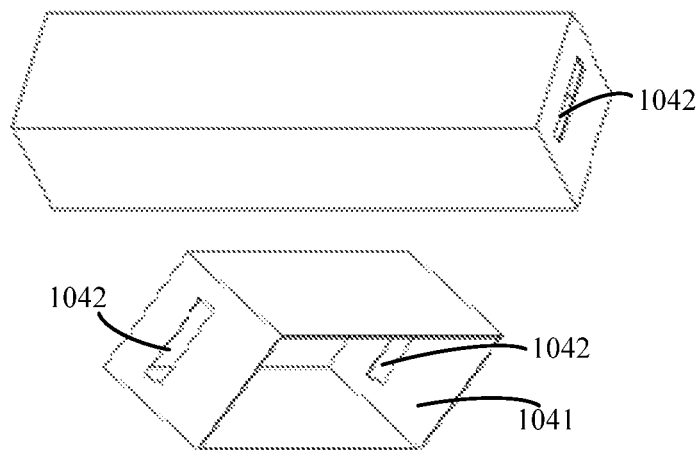
FIG. 3 is a schematic view of the structure of an air guide cover according to another embodiment of the present application.

To show the air guide cover clearly, as shown in FIG. 3, each air guide cover 104 includes a rectangular groove 1041 and two air guide openings 1042 arranged in sidewalls of the rectangular groove. A first air guide opening and a second air guide opening of the two air guide openings are arranged in two sidewalls parallel to each other of the groove, and are perpendicular to the airflow direction.

With the memory bank covered by the above air guide cover having the air guide openings, a small amount of airflow may flow into the air guide cover to dissipate heat of the memory bank covered by the air guide cover, thus ensuring heat dissipation of the memory bank.

In another embodiment of the present application, the first air guide opening of the first air guide cover receives a third airflow, and the third airflow flows from the second air guide opening, to dissipate heat of an inside of the first air guide cover.

In yet another embodiment of the present application, the first air guide opening of the second air guide cover receives a fourth branch airflow branched from the second airflow, and the fourth branch airflow flows out via the second air guide opening of the second air guide cover, to dissipate heat of the inside of the second air guide cover.

In yet another embodiment of the present application, to ensure that the air guide cover can cover the memory bank completely and avoid influence of the air guide cover on layout of modules on the motherboard, the rectangle groove of each air guide cover has a size of 145 mm×40 mm×16 mm. Moreover, to ensure uniform heat dissipation for the memory bank in the air guide cover, the air guide opening is arranged on a sidewall with a size of 40 mm×16 mm of the rectangular groove and has a size of 30 mm×5 mm.

In another embodiment of the present application, to ensure guiding of the air guide cover on the airflow and prevent the airflow from the first chip in one chipset from flowing to the second chip as much as possible, two chips in each chipset have a distance not less than 15 mm.

Figure 4:
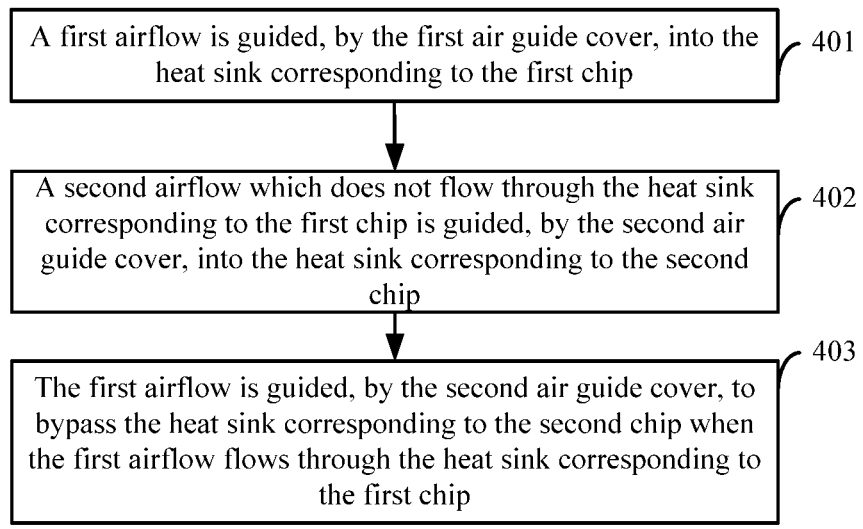
FIG. 4 is a flowchart of a heat dissipation method according to an embodiment of the present application.

As shown in FIG. 4, a heat dissipation method implemented based on the heat dissipation system described above is provided according to an embodiment of the present application, which includes steps 401 to 403.

In step 401, a first airflow is guided, by the first air guide cover, into the heat sink corresponding to the first chip.

In step 402, a second airflow which does not flow through the heat sink corresponding to the first chip is guided, by the second air guide cover, into the heat sink corresponding to the second chip.

In step 403, the first airflow is guided, by the second air guide cover, to bypass the heat sink corresponding to the second chip when the first airflow flows through the heat sink corresponding to the first chip.

In an embodiment of the present application, in the case that card slots are provided on both sides of the chip, the above heat dissipation method further includes: covering, by the first air guide cover, the card slot arranged on the first side of the first chip, and covering, by the second air guide cover, the card slot arranged on the second side of the second chip. Step 402 specifically includes: guiding the second airflow which flows through the card slot corresponding to the first chip and not covered by the air guide cover into the heat sink corresponding to the second chip. Since the heat generated by the memory bank inserted into the card slot is not much, heat dissipation of the memory bank may be not affected in the case that the memory bank is covered by the air guide cover according to the embodiment of the present application. Instead, the air guide cover can affect the airflow direction to ensure uniform heat dissipation of the chip at the front end and the chip at the back end, thus ensuring uniform service life of the chip at the front end and the chip at the back end.

In another embodiment of the present application, in order to achieve heat dissipation of the memory bank in the air guide cover, the heat dissipation method further includes providing two air guide openings for each air guide cover. A first air guide opening and a second air guide opening are arranged on two sidewalls parallel to each other respectively, and are perpendicular to the airflow direction. The first air guide opening of the first air guide cover receives a third airflow, and the third airflow flows out via the second air guide opening, to dissipate heat of an inside of the first air guide cover. The first air guide opening of the second air guide cover receives a fourth branch airflow branched from the second airflow, and the fourth branch airflow flows out via the second air guide opening of the second air guide cover, to dissipate heat of the inside of the second air guide cover.

Figure 5:
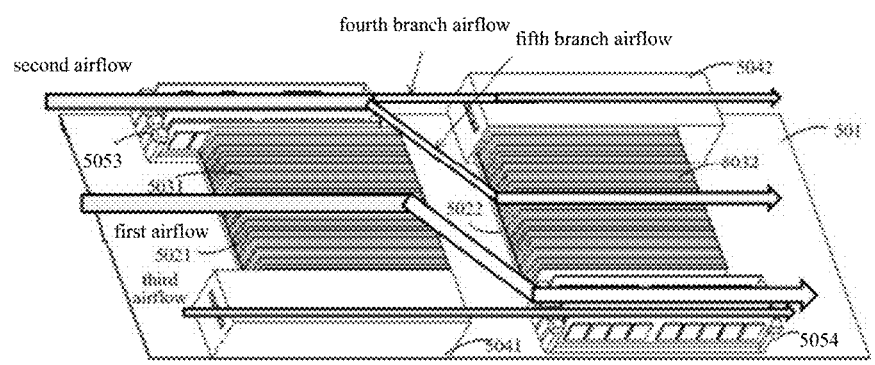
FIG. 5 is a schematic structural diagram of a heat dissipation system according to another embodiment of the present application.
Figure 6:
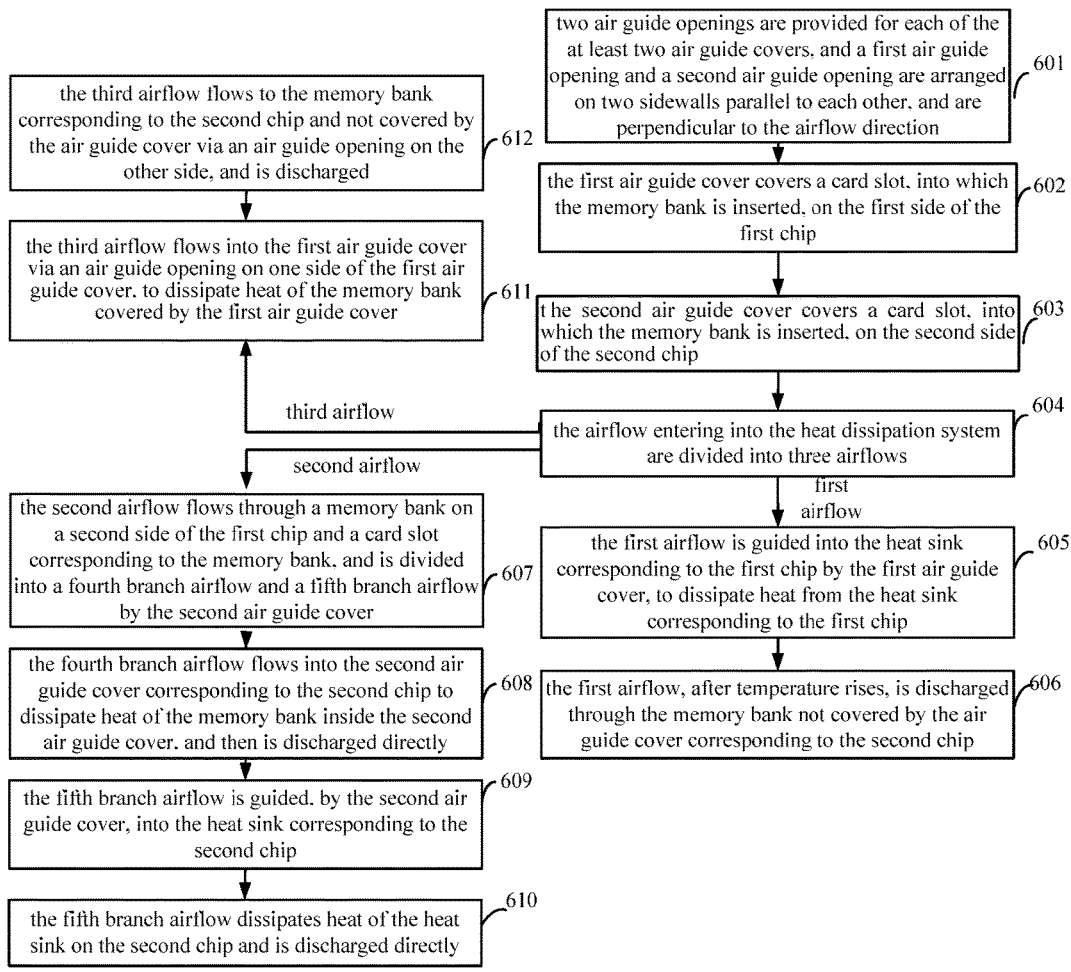
FIG. 6 is a flowchart of a heat dissipation method according to another embodiment of the present application.

To clearly illustrate the heat dissipation method implemented by the above heat dissipation system, in another embodiment of the present application, the heat dissipation method is described taking the heat dissipation system as shown in FIG. 5 as an example. As shown in FIG. 6, the heat dissipation method may include steps 601 to 612.

In step 601, two air guide openings are provided for each of the at least two air guide covers. A first air guide opening and a second air guide opening are respectively arranged on two sidewalls parallel to each other, and are perpendicular to the airflow direction.

As shown in FIG. 5, the heat dissipation system includes: a motherboard 501, a first chip 5021 and a second chip 5022 which are installed on the motherboard, a first heat sink 5031 arranged on the first chip 5021, a second heat sink 5032 arranged on the second chip 5022, a first card slot and a third card slot 5053 which are arranged on both sides of the first chip 5021, a second card slot and a fourth card slot 5054 which are arranged on both sides of the second chip 5022, and peripheral memory banks inserted into the first card slot, the second card slot, the third card slot 5053 and the fourth card slot 5054 respectively.

In step 602, the first air guide cover is configured to cover a card slot, into which the memory bank is inserted, on the first side of the first chip.

As shown in FIG. 5, the first air guide cover 5041 covers the first card slot in which the memory bank is installed.

In step 603, the second air guide cover is configured to cover a card slot, into which the memory bank is inserted, on the second side of the second chip.

As shown in FIG. 5, the second air guide cover 5042 covers the second card slot in which the memory bank is installed.

In step 604, the airflow entering the heat dissipation system are divided into three airflows, i.e. a first airflow in step 605, a second air flow in step 607, and a third airflow in step 611.

In step 605, the first airflow is guided, by the first air guide cover, into the heat sink corresponding to the first chip, to dissipate heat of the heat sink corresponding to the first chip.

As shown in FIG. 5, the first airflow flows into the first heat sink 5031 on the first chip 5021 directly. The heat sink according to the embodiment of the present application includes multiple fins made of copper or aluminium having a good thermal conductivity. The fins can transfer heat of the chip to the heat sink. When flowing into the first heat sink, the first airflow takes away heat of the heat sink to dissipate heat of the chip.

In step 606, the first airflow, after its temperature rises, flows through the memory bank corresponding to the second chip and not covered by the air guide cover, and is discharged, and the present flow path is ended;

As shown in FIG. 5, after flowing through the first sink 5031, the first airflow flows to the memory bank on the fourth card slot 5054 corresponding to the second chip, and is discharged from the memory bank.

In step 607, the second airflow flows through the memory bank on the second side of the first chip and a card slot corresponding to the memory bank, and is divided into a fourth branch airflow and a fifth branch airflow by the second air guide cover.

In step 608, the fourth branch airflow flows into the second air guide cover corresponding to the second chip to dissipate heat of the memory bank inside the second air guide cover, and then is discharged directly.

In step 609, the fifth branch airflow is guided, by the second air guide cover, into the heat sink corresponding to the second chip.

As show in FIG. 5, the second airflow is divided into the fourth branch airflow and the fifth branch airflow. The fourth branch airflow flows into the second air guide cover 5042 to dissipate heat of the memory bank inside the second air guide cover, and then is discharged directly. The fourth branch airflow flows into the second heat sink 5032 on the second chip 5022, to take away heat of the second heat sink 5032. In the whole process, the first airflow flowing through the first heat sink 5031 is prevented from flowing into the second heat sink 5032. Since heat generated by the memory bank is low, a temperature of the second airflow flowing through the memory bank does not rise significantly, the fifth branch airflow divided from the second airflow has better heat dissipation capability for the second heat sink, thereby ensuring uniform heat dissipation for all the chips.

In step 610, the fifth branch airflow dissipates heat of the heat sink on the second chip and is discharged directly, and the present flow path is ended.

In step 611, the third airflow flows into the first air guide cover via an air guide opening on one side of the first air guide cover, to dissipate heat from the memory bank covered by the first air guide cover.

In step 612, the third airflow flows to the memory bank not covered by the air guide cover corresponding to the second chip via the air guide opening on the other side of the first air guide cover, and is discharged.

The air guide opening of the air guide cover is small, therefore, there is a small ainstall of the third airflow in steps 611 and 612, which is enough to dissipate heat from the memory bank in the first air guide cover 5041 corresponding to the first chip.

According to the above solution, the embodiments of the present application at least have the following beneficial effects.

1. The first airflow is guided, by the first air guide cover, into the heat sink corresponding to the first chip in the chipset, to dissipate heat of the first chip. The second airflow which does not flow through the heat sink corresponding to the first chip is guided, by the second air guide cover, into the heat sink corresponding to the second chip. The first airflow is guided to bypass the heat sink corresponding to the second chip by the second air guide cover when the first airflow flows through the heat sink corresponding to the first chip. In the whole heat dissipation process, the second airflow which does not flow through the first chip is used to dissipate heat of the second chip, and the second airflow and the first airflow come from the same source and have similar initial temperatures. Moreover, the first airflow, after flowing through the first chip to rise its temperature, bypasses the heat sink of the second chip, thereby allowing relatively uniform heat dissipation between chips in the server.

2. A part of the memory banks are covered by the air guide covers, in this way, the flow direction of the airflow is guided to a certain degree in one aspect, and a large amount of the airflow is used for the heat sink on the chip while a small amount of the airflow is allocated to the memory bank which dissipates small heat in the other aspect, thereby further ensuring uniform heat dissipation of the server.

3. Since the heat dissipation capability of the chip affects a service life of the chip directly, the service lives of the chips having uniform heat dissipation in the server are also uniform by the heat dissipation method according to the embodiments of the present application.

It should be noted that, the relationship terms such as "first", "second" and the like are only used herein to distinguish one entity or operation from another, rather than to necessitate or imply that an actual relationship or order exists between the entities or operations. Furthermore, the terms such as "include", "comprise" or any other variants thereof means to be non-exclusive. Therefore, a process, a method, an article or a device including a series of elements include not only the disclosed elements but also other elements that are not clearly enumerated, or further include inherent elements of the process, the method, the article or the device. Unless expressively limited otherwise, the statement "including a . . . " does not exclude the case that other similar elements may exist in the process, the method, the article or the device other than enumerated elements.

Those skilled in the art should understand that all of or a part of steps for implementing the above method embodiments may be performed by instructing corresponding hardware with a program. The proceeding program may be stored in a computer readable storage medium. When being executed, the program performs the steps of the above method embodiments. The proceeding storage medium includes various mediums capable of storing program codes, such as a ROM, a RAM, a magnetic disc or an optic disc.

It should be noted finally that, the embodiments described hereinabove are only preferred embodiments of the present application, and should not be interpreted as limitation to the protection scope of the present application. Any modifications, equivalent replacements and improvements made within the spirit and principle of the present application are also deemed to fall into the scope of the present application defined by the claims.

The invention claimed is:

1. A heat dissipation system, comprising a motherboard, at least two chips, at least two heat sinks and at least two air guide covers, wherein
every two chips of the at least two chips constitute a chipset;
the chips in each chipset are installed on the motherboard in sequence along an airflow direction;
each of the at least two heat sinks is installed on a surface of the respective chip;
every two air guide covers of the at least two air guide covers constitute an air guide group;
wherein in each air guide group, a first air guide cover is arranged on a first side of a first chip of the chipset corresponding to the air guide group, which side is parallel to the airflow direction, and is configured to guide a first airflow into the heat sink corresponding to the first chip; and
a second air guide cover is arranged on a second side of a second chip of the chipset corresponding to the air guide group, which side is parallel to the first side and is in the same line with an opposite side of the first side, and is configured to guide a second airflow which does not flow through the heat sink corresponding to the first chip into the heat sink corresponding to the second chip, and guide the first airflow to bypass the heat sink corresponding to the second chip when the first airflow flows through the heat sink corresponding to the first chip.

2. The heat dissipation system according to claim 1, further comprising at least four card slots, wherein
each of the at least four card slots is installed on the motherboard, and every two card slots of the at least four card slots are arranged on both sides parallel to the airflow direction of the chip and configured to insert peripheral memory banks respectively;
the first air guide cover is configured to cover the card slot arranged on the first side; and
the second air guide cover is configured to cover the card slot arranged on the second side and guide the second airflow, which flows through the card slot corresponding to the first chip and not covered by the air guide cover, into the heat sink corresponding to the second chip.

3. The heat dissipation system according to claim 2, wherein
each of the at least two air guide covers comprises: a rectangular groove and two air guide openings arranged on sidewalls of the rectangular groove; and
a first air guide opening and a second air guide opening of the two air guide openings are arranged on the two parallel sidewalls of the rectangular groove, and are perpendicular to the airflow direction.

4. The heat dissipation system according to claim 3, wherein
the first air guide opening of the first air guide cover receives a third airflow, and the third airflow flows out via the second air guide opening of the first air guide cover, to dissipate heat from inside of the first air guide cover.

5. The heat dissipation system according to claim 3, wherein
the first air guide opening of the second air guide cover receives a fourth branch airflow branched from the second airflow, and the fourth branch airflow flows out via the second air guide opening of the second air guide cover, to dissipate heat from inside of the second air guide cover.

6. The heat dissipation system according to claim 3, wherein
the rectangle groove of each of the at least two air guide covers has a size of 145 mm×40 mm×16 mm; and
each of the air guide openings is arranged on the sidewall with a size of 40 mm×16 mm of the rectangular groove, and has a size of 30 mm×5 mm.

7. The heat dissipation system according to claim 1, wherein
the two chips in the chipset have a distance not less than 15 mm.

8. A heat dissipation method implemented based on the heat dissipation system according to claim 1, comprising:
guiding, by the first air guide cover, the first airflow into the heat sink corresponding to the first chip;
guiding, by the second air guide cover, the second airflow which does not flow through the heat sink corresponding to the first chip into the heat sink corresponding to the second chip; and
guiding, by the second air guide cover, the first airflow to bypass the heat sink corresponding to the second chip when the first airflow flows through the heat sink corresponding to the first chip.

9. The heat dissipation method according to claim 8, further comprising:
covering, by the first air guide cover, the card slot arranged on the first side of the first chip; and
covering, by the second air guide cover, the card slot arranged on the second side of the second chip; wherein
the step of guiding the second airflow which does not flow through the heat sink corresponding to the first chip into the heat sink corresponding to the second chip comprises:
guiding the second airflow, which flows through the card slot corresponding to the first chip and not covered by the air guide cover, into the heat sink corresponding to the second chip.

10. The heat dissipation method according to claim 8, further comprising: providing two air guide openings for each of the at least two air guide covers, wherein
a first air guide opening and a second air guide opening are arranged on two sidewalls parallel to each other, and are perpendicular to the airflow direction;
the first air guide opening of the first air guide cover receives a third airflow, and the third airflow flows out via the second air guide opening of the first air guide cover, to dissipate heat from inside of the first air guide cover; and
the first air guide opening of the second air guide cover receives a fourth airflow branched from the second airflow, and the fourth branch airflow flows out via the second air guide opening of the second air guide cover, to dissipate heat from inside of the second air guide cover.

11. The heat dissipation system according to claim 4, wherein the first air guide opening of the second air guide cover receives a fourth branch airflow branched from the second airflow, and the fourth branch airflow flows out via the second air guide opening of the second air guide cover, to dissipate heat from inside of the second air guide cover.

12. The heat dissipation system according to claim 2, wherein the two chips in the chipset have a distance not less than 15 mm.

13. The heat dissipation system according to claim 3, wherein the two chips in the chipset have a distance not less than 15 mm.

14. The heat dissipation system according to claim 4, wherein the two chips in the chipset have a distance not less than 15 mm.

15. The heat dissipation system according to claim 5, wherein the two chips in the chipset have a distance not less than 15 mm.

16. The heat dissipation system according to claim 6, wherein the two chips in the chipset have a distance not less than 15 mm.

17. The heat dissipation method according to claim 9, further comprising: providing two air guide openings for each of the at least two air guide covers, wherein a first air guide opening and a second air guide opening are arranged on two sidewalls parallel to each other, and are perpendicular to the airflow direction;

the first air guide opening of the first air guide cover receives a third airflow, and the third airflow flows out via the second air guide opening of the first air guide cover, to dissipate heat from inside of the first air guide cover; and the first air guide opening of the second air guide cover receives a fourth airflow branched from the second airflow, and the fourth branch airflow flows out via the second air guide opening of the second air guide cover, to dissipate heat from inside of the second air guide cover.

* * * * *